United States Patent
Yoon et al.

(10) Patent No.: US 7,259,430 B2
(45) Date of Patent: Aug. 21, 2007

(54) NON-VOLATILE MEMORY DEVICE AND METHOD OF MANUFACTURING THE SAME

(75) Inventors: Jae-Man Yoon, Seoul (KR); Tae-Yong Kim, Gyeonggi-do (KR); Dong-Gun Park, Gyeonggi-do (KR); Choong-Ho Lee, Gyeonggi-do (KR)

(73) Assignee: Samsung Electronics Co., Ltd, Suwon-si, Gyeonggi-do (KR)

( * ) Notice: Subject to any disclaimer, the term of this patent is extended or adjusted under 35 U.S.C. 154(b) by 167 days.

(21) Appl. No.: 11/073,134

(22) Filed: Mar. 4, 2005

(65) Prior Publication Data

US 2005/0205924 A1    Sep. 22, 2005

(30) Foreign Application Priority Data

Mar. 16, 2004  (KR) .................. 10-2004-0017574

(51) Int. Cl.
    H01L 29/94    (2006.01)
(52) U.S. Cl. .............. 257/365; 438/259; 438/283; 438/284; 257/E29.112; 257/E29.129; 257/E29.13
(58) Field of Classification Search ........... 438/257, 438/259, 283, 284; 257/365, E29.112, E29.129, 257/E29.13
    See application file for complete search history.

(56) References Cited

U.S. PATENT DOCUMENTS

| 6,468,862 | B1 * | 10/2002 | Tseng | 438/259 |
| 7,005,700 | B2 * | 2/2006 | Lee | 257/316 |
| 2002/0093073 | A1 * | 7/2002 | Mori et al. | 257/510 |
| 2003/0042531 | A1 | 3/2003 | Lee et al. | |
| 2003/0151077 | A1 | 8/2003 | Mathew et al. | |
| 2003/0178670 | A1 | 9/2003 | Fried et al. | |
| 2005/0227435 | A1 * | 10/2005 | Oh et al. | 438/257 |
| 2005/0266638 | A1 * | 12/2005 | Cho et al. | 438/257 |
| 2005/0272192 | A1 * | 12/2005 | Oh et al. | 438/197 |

FOREIGN PATENT DOCUMENTS

| KR | 1997-0060484 | 8/1997 |
| KR | 2001-0003086 | 1/2001 |

OTHER PUBLICATIONS

English language abstract of Korean Publication No. 1997-0060484.
English language abstract of Korean Publication No. 2001-0003086.

* cited by examiner

*Primary Examiner*—Trung Dang
(74) *Attorney, Agent, or Firm*—Marger Johnson & McCollom, P.C.

(57) ABSTRACT

A non-volatile memory device includes a fin body protruded from a semiconductor substrate. The fin body has first and second side surfaces opposite to each other. An inner dielectric layer pattern is formed on an upper surface, and the first and second side surfaces of the fin body. A floating gate electrode is formed on the inner dielectric layer pattern. The floating gate electrode has an uneven upper surface. An outer dielectric layer is formed on the floating gate electrode. A control gate electrode is formed on the outer dielectric layer.

38 Claims, 12 Drawing Sheets

NON-VOLATILE MEMORY DEVICE AND METHOD OF MANUFACTURING THE SAME

CROSS REFERENCE TO RELATED APPLICATIONS

This application claims priority from Korean Patent Application No. 2004-17574, filed on Mar. 16, 2004, the contents of which are herein incorporated by reference in its entirety for all purposes.

BACKGROUND OF THE INVENTION

1. Field of the Invention

This disclosure relates generally to non-volatile memory devices and methods of manufacturing the same. More particularly, this disclosure relates to a non-volatile memory device having a fin body and methods of manufacturing the device.

2. Description of the Related Art

Generally, semiconductor devices are classified into volatile memory devices and non-volatile memory devices. An example of a volatile memory device includes a dynamic random access memory (DRAM) device. Examples of non-volatile memory devices include a read only memory (ROM) device, an electrically erasable programmable read only memory (EEPROM) device, etc. An example of an EEPROM device includes a flash memory device.

A conventional planar flash memory device includes source/drain regions and a channel region formed on a semiconductor substrate such as a silicon wafer, a first dielectric layer formed on the semiconductor substrate, a floating gate electrode formed on the first dielectric layer, a second dielectric layer formed on the floating gate electrode, and a control gate electrode formed on the second dielectric layer.

Recently, as flash memory devices have been highly integrated, a flash memory device having a fin body in which an active region is formed has been widely developed. Examples of fin-type flash memory devices are disclosed in U.S. patent application Publication Nos. 2003-151077, 2003-178670 and 2003-42531.

On the other hand, the operation voltage of the flash memory device may be determined in accordance with a first capacitance C1 between the channel region and the floating gate electrode, and a second capacitance C2 between the floating gate electrode and the control gate electrode. The coupling ratio Cr of the flash memory device is the ratio between the operation voltage Vg applied to the control gate electrode and the voltage Vf induced in the floating gate electrode. The coupling ratio may be represented by the following formula:

$$Cr = Vf/Vg = C2/(C1+C2)$$

Since the first dielectric layer in the fin-type flash memory device is formed on an upper surface and side surfaces of the fin body that is protruded from the semiconductor substrate, the first dielectric layer in the fin-type flash memory device has an area broader than that of the first dielectric layer in the planar flash memory device. Thus, the first capacitance between the channel region formed in the fin body and the floating gate electrode is increased so that the coupling ratio is decreased. This may cause an increase in the operation voltage of the fin-type flash memory device.

Further, because the floating gate electrode in the fin-type flash memory device encloses the first dielectric layer on the fin body, a process align margin between the floating gate electrode and the fin body may not be sufficiently guaranteed.

SUMMARY OF THE INVENTION

The invention provides a non-volatile memory device having an increased coupling ratio and a self-aligned floating gate electrode. The invention also provides methods of manufacturing the above-mentioned non-volatile memory device.

In one embodiment, a non-volatile memory device includes a fin body protruded from a semiconductor substrate. The fin body has first and second side surfaces opposite to each other. An inner dielectric layer pattern is formed on an upper surface, and the first and second side surfaces of the fin body. A floating gate electrode is formed on the inner dielectric layer pattern. The floating gate electrode has an uneven upper surface. An outer dielectric layer is formed on the floating gate electrode. A control gate electrode is formed on the outer dielectric layer.

In another embodiment, a non-volatile memory device includes a fin body protruded from a semiconductor substrate. The fin body has first and second side surfaces opposite to each other. An inner dielectric layer pattern includes a first dielectric layer pattern formed on an upper surface of the fin body, second dielectric layer patterns formed on the first and second side surfaces of the fin body, respectively, and third dielectric layer patterns upwardly extending from the second dielectric layer patterns. A floating gate electrode is formed on the inner dielectric layer pattern. An outer dielectric layer is formed on the floating gate electrode. A control gate electrode is formed on the outer dielectric layer.

In another embodiment, a non-volatile memory device includes a fin body protruded from a semiconductor substrate. The fin body has first and second side surfaces opposite to each other. An inner dielectric layer pattern is formed on an upper surface, and the first and second side surfaces of the fin body and haves an H-shaped cross section. A floating gate electrode is formed on the inner dielectric layer pattern. An outer dielectric layer is formed on the floating gate electrode. A control gate electrode is formed on the outer dielectric layer.

In yet another embodiment, a non-volatile memory device includes a fin body protruded from a semiconductor substrate. The fin body has first and second sides opposite to each other. An inner dielectric layer pattern is formed on an upper surface, and the first and second side surfaces of the fin body. A floating gate electrode includes a first conductive layer pattern formed the upper surface of the inner dielectric layer pattern, second conductive layer patterns formed on side surfaces of the inner dielectric layer pattern and having a height higher than that of the first conductive layer pattern, and third conductive layer patterns electrically connected between the first and second conductive layer patterns. An outer dielectric layer is formed on the floating gate electrode. A control gate electrode is formed on the outer dielectric layer.

According to another embodiment of the invention, a method of manufacturing the non-volatile memory device comprises sequentially forming a first dielectric layer and a first conductive layer on a semiconductor substrate. The first conductive layer, the first dielectric layer and the semiconductor substrate are etched to form a fin body protruded from the semiconductor substrate and having first and second side surfaces opposite to each other, a first dielectric layer pattern and a first conductive layer pattern. Second dielectric layer patterns are formed on the fin body, the first dielectric layer pattern and side surfaces of the first conductive layer pattern. A floating gate electrode having an uneven upper surface is formed on the first and second dielectric layer patterns. An outer dielectric layer is formed on the floating gate electrode. A control gate electrode is then formed on the outer dielectric layer.

In another embodiment, the method of manufacturing the non-volatile memory device comprises sequentially forming a first dielectric layer, a first conductive layer and a hard mask layer on a semiconductor substrate. The hard mask layer, the first conductive layer, the first dielectric layer and the semiconductor substrate are etched to form a fin body protruded from the semiconductor substrate, a first dielectric layer pattern, a first conductive layer pattern and a hard mask. Second dielectric layer patterns are formed on the fin body, the first dielectric layer pattern and side surfaces of the first conductive layer pattern. A second conductive layer is formed on the hard mask and the second dielectric layer pattern. The second conductive layer is partially removed for exposing an upper surface of the hard mask to form second conductive layer patterns on the hard mask and side surfaces of the second dielectric layer patterns. The hard mask is then removed to expose the first conductive layer pattern. Third conductive layer patterns for electrically connecting the first conductive layer pattern to the second conductive layer pattern are formed on the first and second conductive layer patterns to form a floating gate electrode including the first, second and third conductive layer patterns. An outer dielectric layer is formed on the floating gate electrode. A control gate electrode is then formed on the outer dielectric layer.

In another embodiment, the method of manufacturing the non-volatile memory device comprises sequentially forming a first dielectric layer, a first conductive layer and a hard mask layer on a semiconductor substrate. The hard mask layer, the first conductive layer, the first dielectric layer and the semiconductor substrate are etched to form a fin body protruded from the semiconductor substrate, a first dielectric layer pattern, a first conductive layer pattern and a hard mask. Second dielectric layer patterns are formed on the fin body, the first dielectric layer pattern, the first conductive layer pattern and the hard mask. A second conductive layer is formed on the second dielectric layer pattern. The second conductive layer and the second dielectric layer are partially removed for exposing an upper surface of the hard mask to form a second conductive layer pattern on the second dielectric layer. The hard mask is removed to expose the first conductive layer pattern and the second dielectric layer. The exposed second dielectric layer is then removed. A third conductive layer pattern for electrically connecting the first conductive layer pattern to the second conductive layer pattern is formed on the first and second conductive layer patterns to form a floating gate electrode including the first, second and third conductive layer patterns. An outer dielectric layer is formed on the floating gate electrode. A control gate electrode is then formed on the outer dielectric layer.

According to the invention, an area of the floating gate electrode is increased so that the coupling ratio of the non-volatile memory device may be increased without increasing an area of a cell. Also, the floating gate electrode may be self-aligned with the inner dielectric layer pattern on the fin body by first, second and third conductive layer patterns. Accordingly, a photolithography process and an etching process for forming the floating gate electrode may be omitted.

BRIEF DESCRIPTION OF THE DRAWINGS

The above and other features and advantages of embodiments of the invention will become readily apparent by reference to the following detailed description when considered in conjunction with the accompanying drawings.

FIGS. 16 and 17 are cross-sectional views illustrating another method of manufacturing the non-volatile memory device of FIG. 1.

DESCRIPTION OF THE EMBODIMENTS

Figure 1:
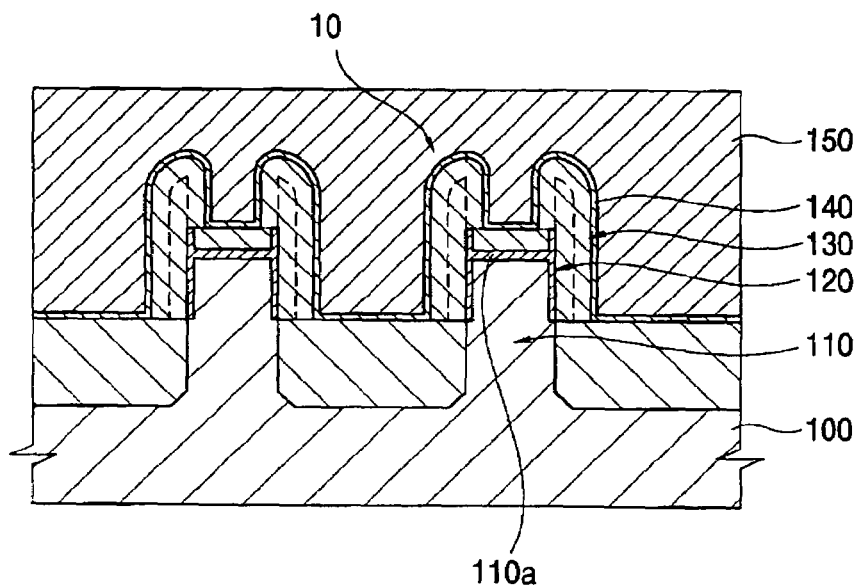
FIG. 1 is a cross-sectional view illustrating a fin-type non-volatile memory device in accordance with one embodiment of the invention.

The invention will be described below with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like reference numerals refer to similar or identical elements throughout. It will be understood that when an element such as a layer, a region or a substrate is referred to as being "on" or "onto" another element, it can be directly on the other element or intervening elements may also be present.

Figure 2:
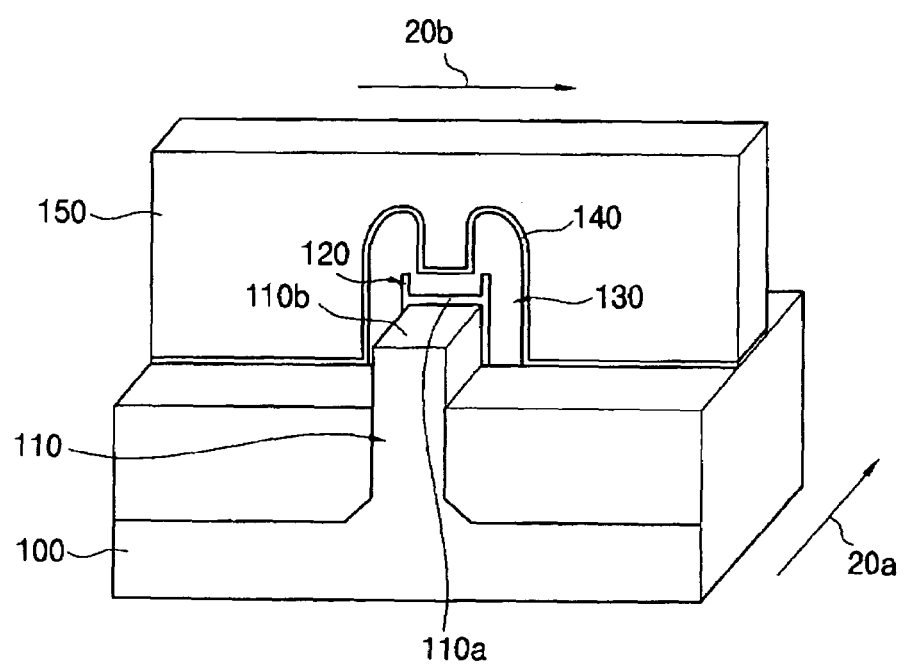
FIG. 2 is a perspective view illustrating the non-volatile memory device of FIG. 1.
Figure 3:
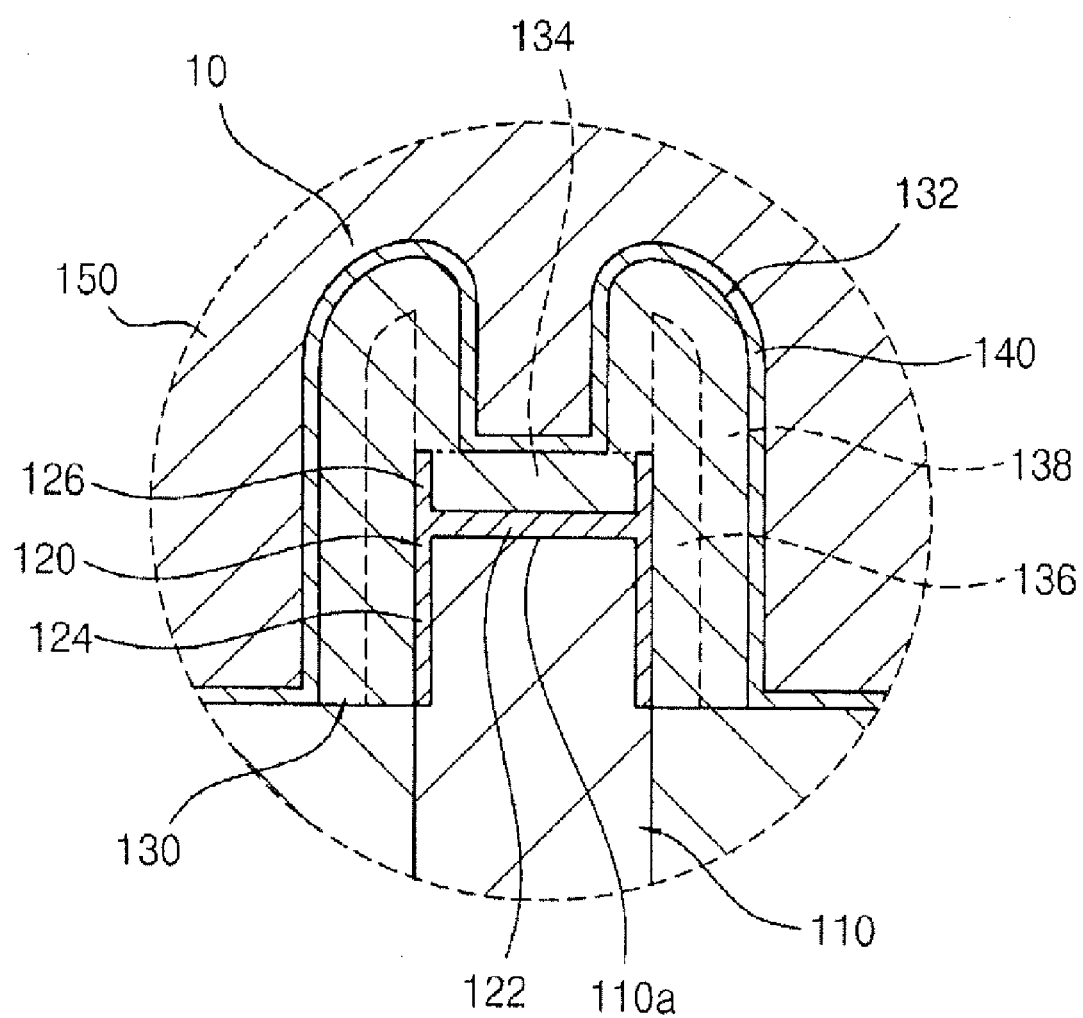
FIG. 3 is an enlarged cross-sectional view illustrating the non-volatile memory device of FIG. 1.

FIG. 1 is a cross-sectional view illustrating a fin-type non-volatile memory device in accordance with one embodiment of the invention, FIG. 2 is a perspective view illustrating the non-volatile memory device of FIG. 1, and FIG. 3 is an enlarged cross-sectional view illustrating the non-volatile memory device of FIG. 1.

Referring to FIGS. 1 to 3, a non-volatile memory device 10 includes a fin body 110 protruded from a semiconductor substrate 100 such as a silicon wafer, an inner dielectric layer pattern 120 formed on a first portion 110a of the fin body 110, a floating gate electrode 130 formed on the inner dielectric layer pattern 120, an outer dielectric layer 140 formed on the floating gate electrode 130, and a control gate electrode 150 formed on the outer dielectric layer 140.

The fin body 110 extends in a first direction 20a substantially perpendicular to a protruded direction of the fin body 110. The control gate electrode 150 extends in a second direction 20b substantially perpendicular to the first direction 20a. Namely, the second direction 20b is substantially perpendicular to a length direction and the protruded direction of the fin body 110, respectively.

The inner dielectric layer pattern 120 is formed on the first portion 110a of the fin body 110. A channel region (not shown) is formed in the first portion 110a of the fin body 110. Source/drain regions (not shown) doped with impurities are formed in second portions 110b of the fin body 110 opposite to each other with respect to the first portion 110a. The impurities may be implanted into the second portions 110b of the fin body 110 by an ion-implanting process.

The inner dielectric layer pattern 120 has an H-shaped cross section. The inner dielectric layer pattern 120 includes a first dielectric layer pattern 122 formed on an upper surface of the fin body 110, second dielectric layer patterns 124 formed on first and second side surfaces of the fin body 110, and third dielectric layer patterns 126 upwardly extending from upper ends of the second dielectric layer patterns 124. Alternatively, the second dielectric layer patterns 124 and the third dielectric layer patterns 126 may be integrally formed with each other.

To decrease a first capacitance between the channel region in the fin body 110 and the floating gate electrode 130, examples of the inner dielectric layer pattern 120 include a silicon oxide layer, a silicon oxide layer doped with fluorine, a silicon oxide layer doped with carbon, a layer including a low-k material, etc. Examples of the low-k material include an organic polymer such as polyallylether based resin, cyclic fluoric resin, siloxane copolymer, fluoro polyallylether based resin, polypentafluorostyrene, polytetraflurostyrene based resin, fluoro polyimide resin, fluoro polynaphthalene, polycide resin and so on. The organic polymer may be formed by a plasma enhanced chemical vapor deposition (PECVD) process, a high-density plasma chemical vapor deposition (HDP-CVD) process, an atmospheric pressure chemical vapor deposition (APCVD) process and so on.

To increase a second capacitance between the floating gate electrode 130 and the control gate electrode 150, examples of the outer dielectric layer 140 include an oxide-nitride-oxide (ONO) layer, a layer including a high-k material, etc. Examples of high-k materials include $Y_2O_3$, $HfO_2$, $ZrO_2$, $Nb_2O_5$, $BaTiO_3$, $SrTiO_3$, and so on. The high-k material may be deposited by an atomic layer deposition (ALD) process or the like.

Further, to increase the second capacitance, the floating gate electrode 130 has an uneven upper surface. The uneven upper surface may be formed by a pair of protrusions 132 opposite to each other in the second direction 20b. One skilled in the art, however, will appreciate that the uneven upper surface may be formed by other methods or structures. Also, the protrusions 132 may enclose the third dielectric layer patterns 126.

Accordingly, since the area of the floating gate electrode 130 is broadened, the second capacitance between the floating gate electrode 130 and the control gate electrode 150 is relatively increased compared to that of conventional fin-type non-volatile memory devices. However, the first capacitance between the fin body 110 and the floating gate electrode 130 is substantially identical to that of conventional fin-type non-volatile memory devices. As a result, the coupling ratio in the non-volatile memory device 10 may be increased so that the operation voltage of the non-volatile memory device 10 may be decreased.

The floating gate electrode 130 includes a first conductive layer pattern 134 formed on the first dielectric layer pattern 122, second conductive layer patterns 136 formed on the second and third dielectric layer patterns 124 and 126, and a third conductive layer pattern 138 electrically connected between the first and second conductive layer patterns 134 and 136. Here, the third conductive layer pattern 138 may enclose the second conductive layer patterns 136 to electrically connect the second conductive layer patterns 136 to the first conductive layer pattern 134. Also, the second conductive layer patterns 136 may upwardly extend from the third dielectric layer patterns 126.

Meanwhile, the floating gate electrode 130 and the control gate electrode 150 may include polysilicon doped with impurities. Further, the control gate electrode 150 may include a polysilicon layer (not shown) doped with impurities and a metal silicide layer (not shown). Examples of the metal silicide layer include a tungsten silicide layer, a titanium silicide layer, a cobalt silicide layer, a tantalum silicide layer, etc.

FIGS. 4 to 17 are cross-sectional views illustrating a method of manufacturing the non-volatile memory device of FIG. 1.

Figure 4:
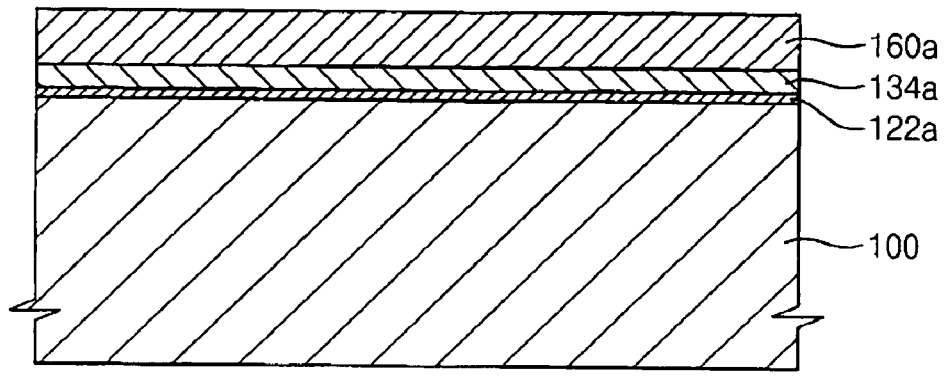
FIGS. 4 to 17 are cross-sectional views illustrating a method of manufacturing the non-volatile memory device of FIG. 1.

Referring to FIG. 4, a first dielectric layer 122a having a thickness of about 100 Å is formed on a semiconductor substrate 100. A first conductive layer 134a having a thickness of about 300 Å is formed on the first dielectric layer 122a. A hard mask layer 160a having a thickness of about 600 Å is formed on the first conductive layer 134a.

Examples of the first dielectric layer 122a include a silicon oxide layer, a silicon oxide layer doped with fluorine, a silicon oxide layer doped with carbon, a layer including a low-k material, etc. The first dielectric layer 122a may be formed by an oxidation process, a CVD process, etc.

An example of the first conductive layer 134a is a doped polysilicon layer. Particularly, impurities are implanted into the polysilicon layer by an in-situ process during the formation of the polysilicon layer by a low pressure chemical vapor deposition (LPCVD) process to form the first conductive layer 134a including the doped polysilicon layer. Alternatively, the polysilicon layer may be formed on the first dielectric layer 122a by an LPCVD process. Impurities may then be implanted into the polysilicon layer by an ion implantation process or an impurity diffusion process to form the first conductive layer 134a.

Examples of the hard mask layer 160a include a silicon nitride layer, a silicon oxide layer, etc. The hard mask layer 160a may be formed by an LPCVD process, a PECVD process, etc.

Figure 5:
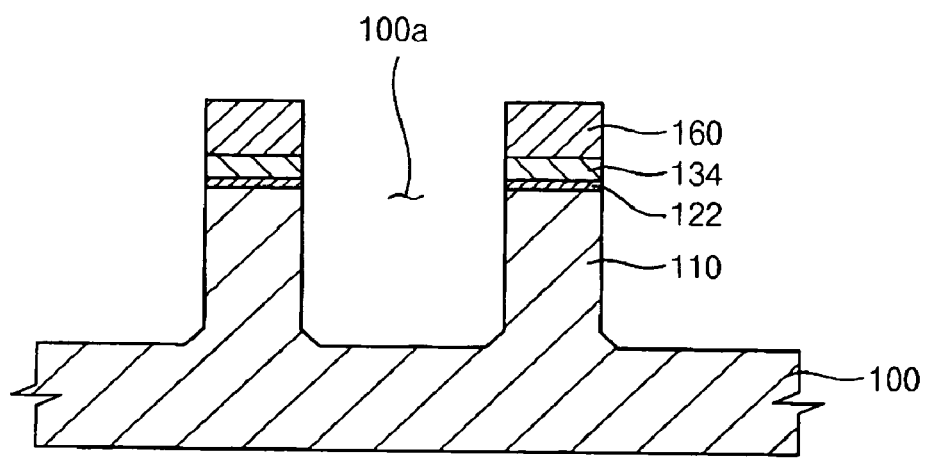

Referring to FIG. 5, the hard mask layer 160a, the first conductive layer 134a, the first dielectric layer 122a and a surface of the semiconductor substrate 100 are anisotropically etched to form a fin body 110 protruded from the semiconductor substrate 100, a first dielectric layer pattern 122, a first conductive layer pattern 134 and a hard mask 160. Here, the fin body 110 extends in a first direction 20a (see FIG. 2) substantially perpendicular to a protruded direction of the fin body 110. Also, the fin body 110 has a first side surface and a second side surface that are exposed through recesses 100a formed in the anisotropic etching process.

In particular, examples of the etching process for forming the fin body 110, the first dielectric layer pattern 122, the first conductive layer pattern 134 and the hard mask 160 include a dry etching process such as a plasma etching process, a reactive ion etching process, etc. The fin body 110 may have a height of about 2,000 Å to about 3,000 Å from the surface of the semiconductor substrate 100.

The hard mask 160 may be formed using a photoresist pattern as an etching mask. The first conductive layer pattern 134, the first dielectric layer pattern 122 and the fin body 110 may be formed using the hard mask 160 as an etching mask. The photoresist pattern may be formed by a photolithography process and may then be removed by an ashing process and a stripping process.

Figure 6:
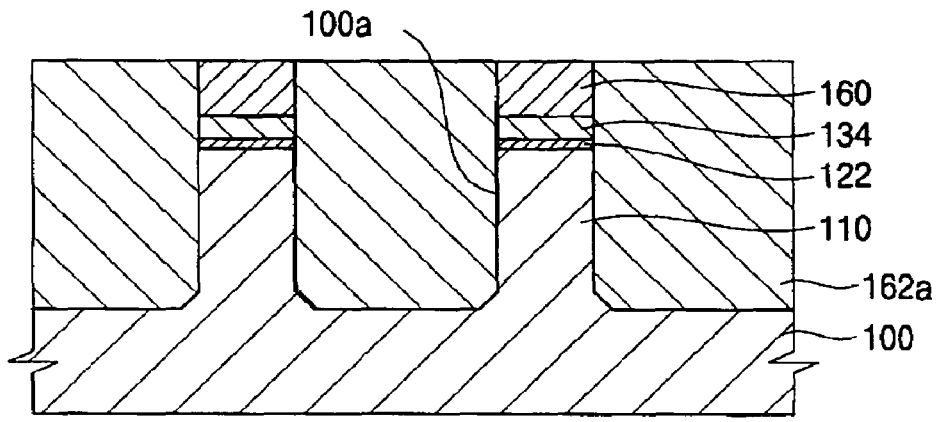

Referring to FIG. 6, an insulation layer 162a is formed on the semiconductor substrate 100 and the hard mask 160 to fill the recesses 100a with the insulation layer 162a. The insulation layer 162a is planarized to expose an upper surface of the hard mask 160.

The insulation layer 162a may have a thickness of about 4,000 Å to about 6,000 Å. The insulation layer 162a may include a silicon oxide layer formed by a CVD process, an HDP-CVD process, etc. Also, the insulation layer 162a may be planarized by a chemical mechanical polishing (CMP) process.

Figure 7:
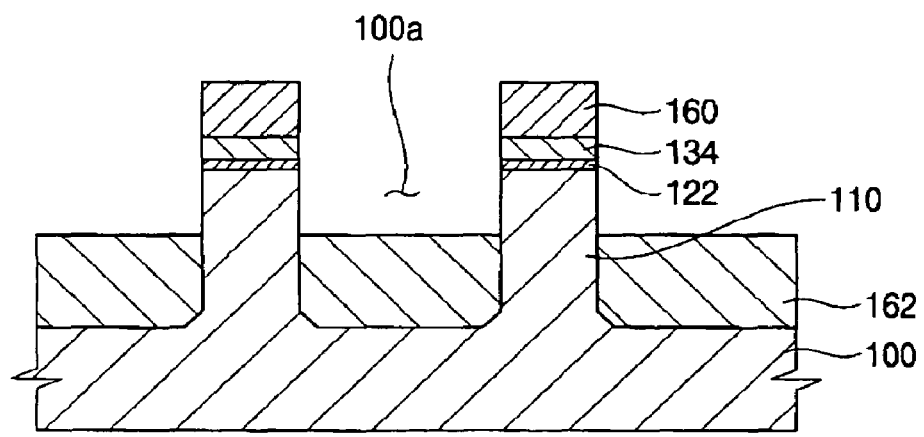

Referring to FIG. 7, the planarized insulation layer 162a is partially removed for exposing the first and second side surfaces of the fin body 110 through the recesses 100a to form an insulation layer pattern 162 on bottom faces of the recesses 100a. The planarized insulation layer 162a may be removed by an isotropic etching process or an anisotropic etching process. The thickness of the planarized insulation layer 162a removed may be about 1,500 Å to about 2,000 Å. The insulation layer pattern 162 electrically isolates non-volatile memory devices from each other.

Figure 8:
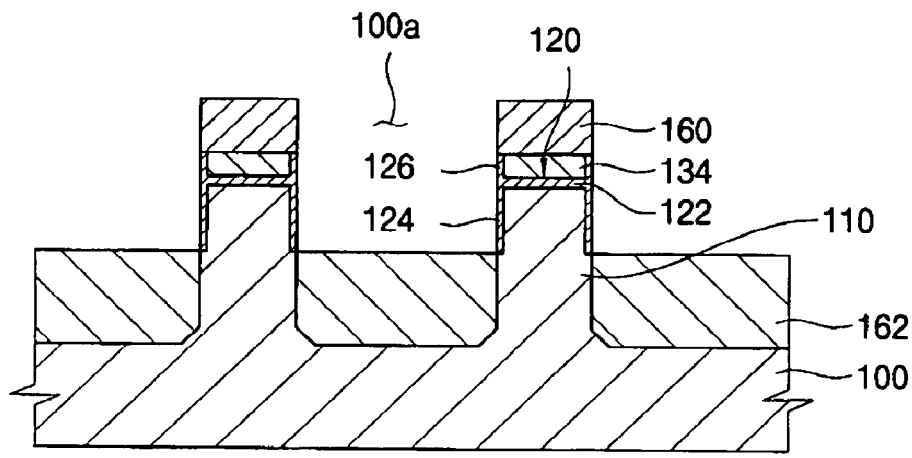

Referring to FIG. 8, second dielectric layer patterns 124 are formed on the first and second side surfaces of the fin body 110. Third dielectric layer patterns 126 are formed on side surfaces of the first conductive layer pattern 134. The second and third dielectric layer patterns 124 and 126 may be formed by an oxidation process to form an inner dielectric layer pattern 120 having an H-shaped cross section. Here, examples of the second and third dielectric layer patterns 124 and 126 include a silicon oxide layer, a silicon oxide layer doped with fluorine, a silicon oxide layer doped with carbon, etc.

The second and third dielectric layer patterns 124 and 126 may be integrally formed with each other by the oxidation process. The second and third dielectric layer patterns 124 and 126 are connected to the first dielectric layer pattern 122. That is, the third dielectric layer patterns 126 upwardly extend from portions at which the first and second dielectric layer patterns 122 and 124 are connected to each other. Here, the second and third dielectric layer patterns 124 and 126 may have a thickness of about 20 Å to about 100 Å.

Figure 9:
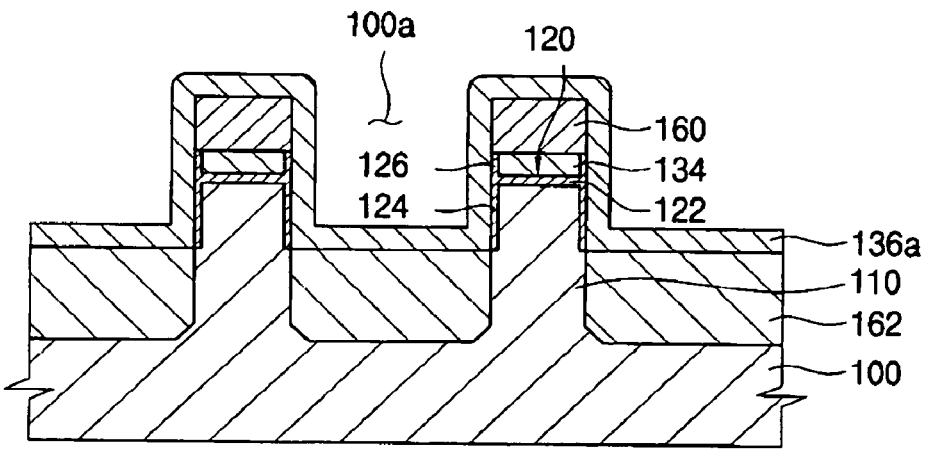

Referring to FIG. 9, a second conductive layer 136a is formed on the hard mask 160, the second dielectric layer patterns 124, the third dielectric layer patterns 126 and the insulation layer pattern 162. An example of the second conductive layer 136a is a polysilicon layer doped with impurities. The second conductive layer 136a may be formed by an LPCVD process and an impurity-doping process. Here, the second conductive layer 136a may have a thickness of about 200 Å to about 500 Å.

Figure 10:
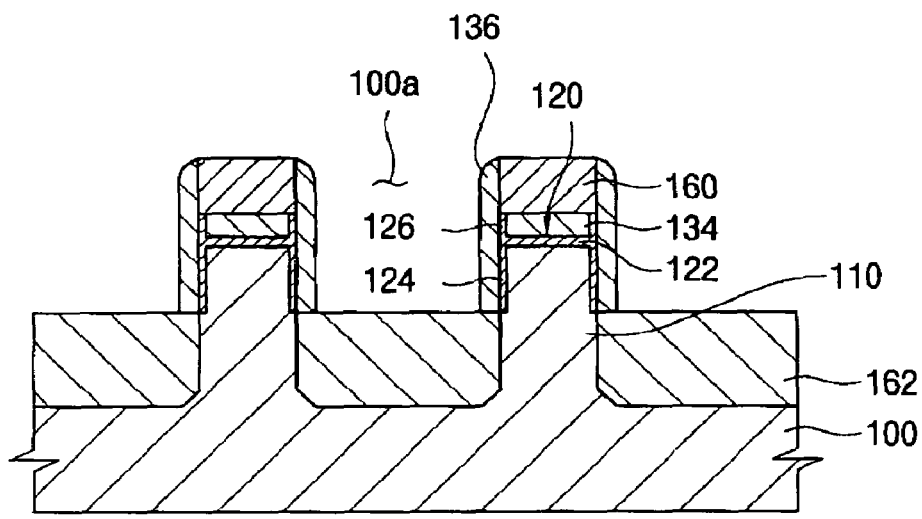

Referring to FIG. 10, the second conductive layer 136a is partially removed by an etch-back process for exposing upper surfaces of the hard mask 160 and the insulation layer patterns 162 to form second conductive layer patterns 136 on side surfaces of the hard mask 160, the second dielectric layer patterns 124 and the third dielectric layer patterns 126.

Figure 11:
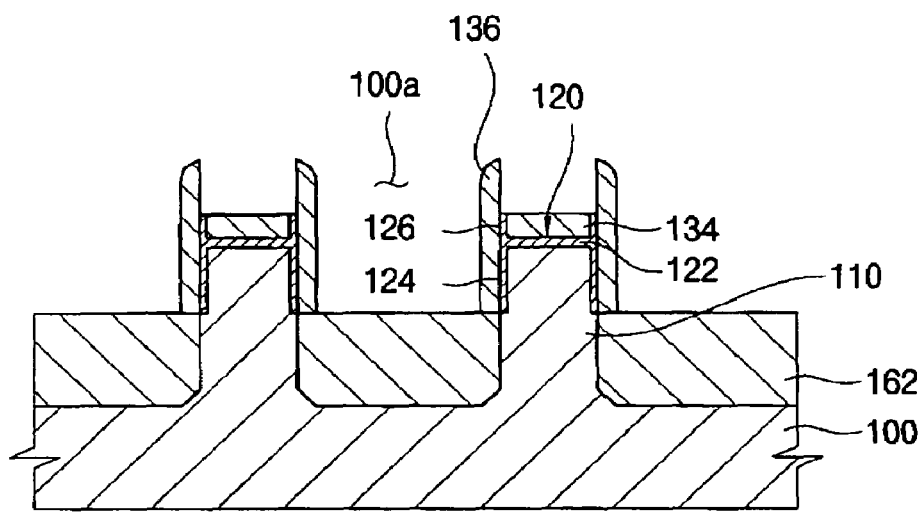

Referring to FIG. 11, the exposed hard mask 160 (see FIG. 10) is removed by an etch-back process. When the hard mask 160 includes a silicon nitride layer pattern, the hard mask 160 may be removed by a wet etching process using an etchant such as phosphoric acid (H3PO4).

Figure 12:
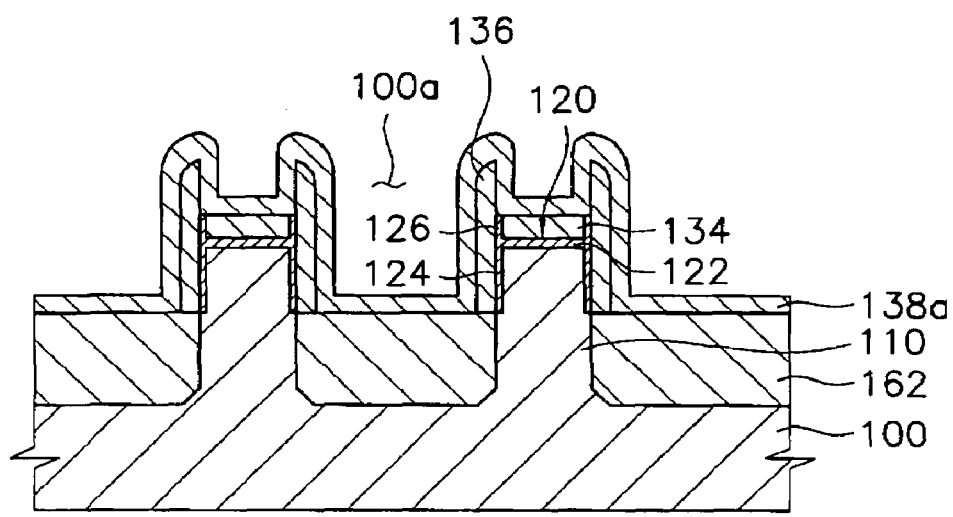

Referring to FIG. 12, a third conductive layer 138a is formed on the first conductive layer 134, the second conductive layer patterns 136 and the insulation layer patterns 162 to electrically connect the first conductive layer pattern 134 to the second conductive layer patterns 136. An example of the third conductive layer 138a is a polysilicon layer doped with impurities. The third conductive layer 138a may be formed by an LPCVD process and an impurity-doping process. Here, the third conductive layer 136a may have a thickness of about 100 Å to about 300 Å.

Figure 13:
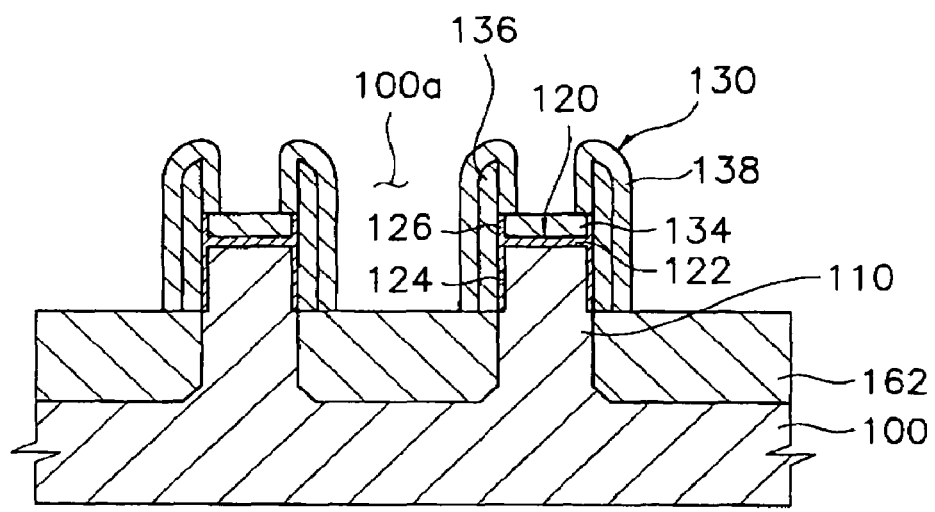

Referring to FIG. 13, the third conductive layer 138a on the insulation layer patterns 162 is partially removed to form a third conductive layer pattern 138 exposing the insulation layer patterns 162. The third conductive layer 138a may be removed by an etch-back process, an anisotropic etching process, etc.

As a result, a floating gate electrode 130 including the first, second, and third conductive layer patterns 134, 136, and 138 is completed. Here, since the second conductive layer patterns 136 are upwardly protruded, the floating gate electrode 130 has an increased surface area.

Figure 14:
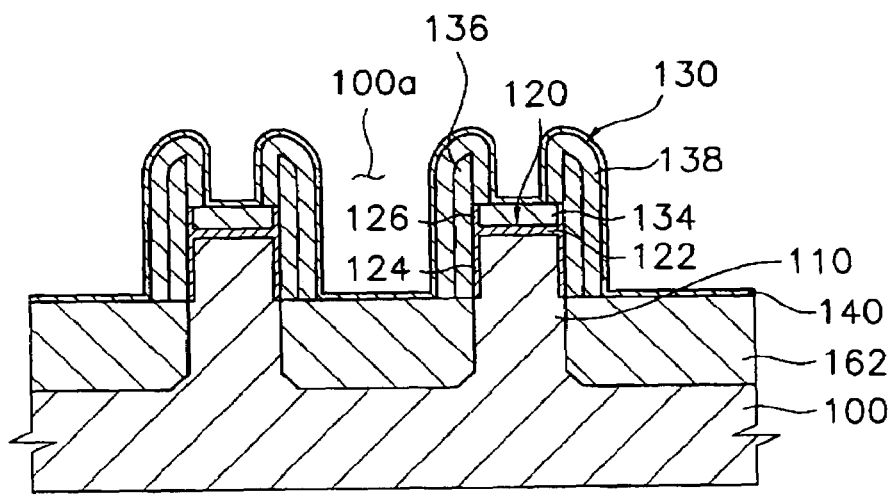

Referring to FIG. 14, an outer dielectric layer 140 is formed on the floating gate electrode 130 and the insulation layer patterns 162. Examples of the outer dielectric layer 140 include an oxide-nitride-oxide (ONO) layer, a layer including a high-k material, etc. The ONO layer may be formed by a CVD process, an LPCVD process, an HDP-CVD process, etc. The high-k material may be deposited by a metal organic chemical vapor deposition (MOCVD) process, a physical vapor deposition (PVD) process, an ALD process, etc. Examples of high-k materials include $Y_2O_3$, $HfO_2$, $ZrO_2$, $Nb_2O_5$, $BaTiO_3$, $SrTiO_3$, etc.

Figure 15:
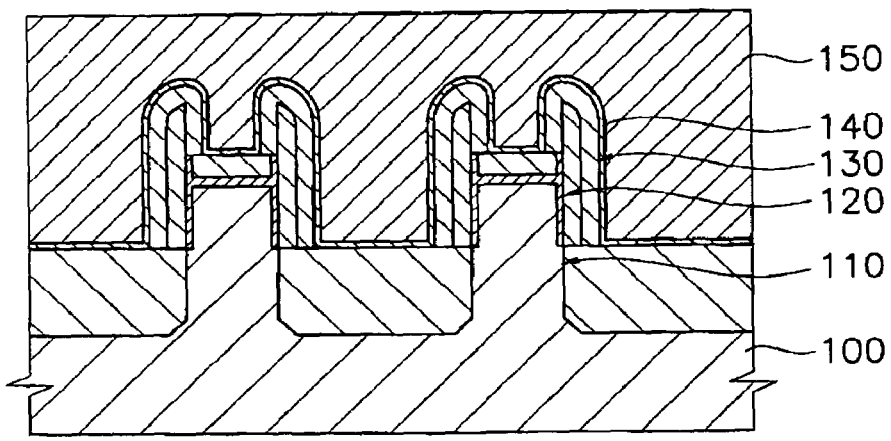

Referring to FIG. 15, a control gate 150 is formed by forming a fourth conductive layer on the outer dielectric layer 140. An example of the fourth conductive layer is a polysilicon layer doped with impurities. The fourth conductive layer may be formed by an LPCVD process, an impurity-doping process, etc. Additionally, a metal silicide layer (not shown) may be formed on the fourth conductive layer.

A second hard mask layer (not shown) is formed on the fourth conductive layer. The second hard mask layer is patterned to form a second hard mask (not shown). The fourth conductive layer is anisotropically etched using the second hard mask as an etching mask for exposing the fin body 110 to form a control gate electrode 150.

In forming the control gate electrode 150, impurities are implanted into second portions 110b of the fin body 110 to form source/drain regions (not shown), thereby completing the fin-type non-volatile memory device 10 in FIG. 2.

Figure 16:
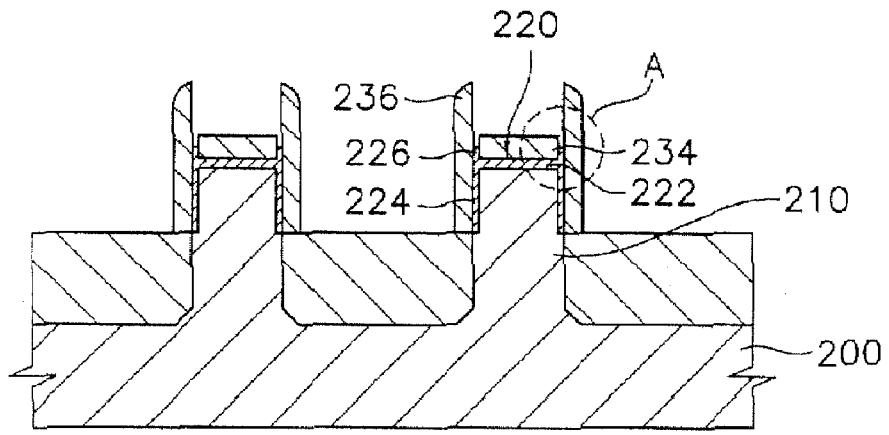
Figure 17:
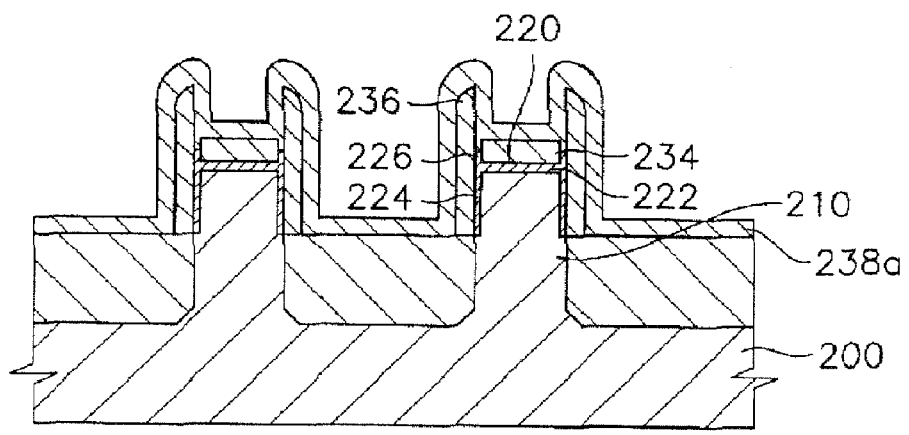
Figure 18:
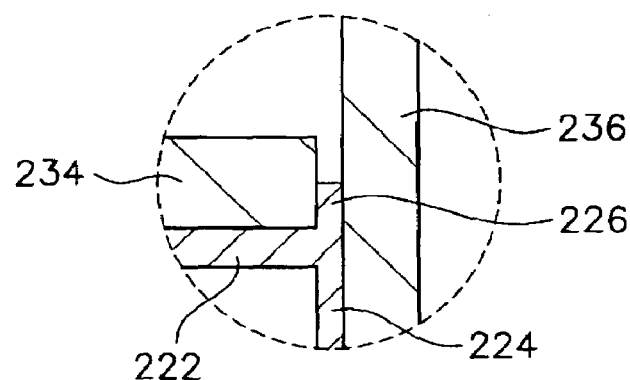
FIG. 18 is an enlarged cross-sectional view of a portion "A" in FIG. 16.

FIGS. 16 and 17 are cross-sectional views illustrating another method of manufacturing a non-volatile memory device, and FIG. 18 is an enlarged cross-sectional view of a portion "A" in FIG. 16.

Referring to FIGS. 16 to 18, an inner dielectric layer pattern 220 including a fin body 210, a first dielectric layer pattern 222, second dielectric layer patterns 224 and third dielectric layer patterns 226 is formed on a semiconductor substrate 200. A first conductive layer pattern 234 is formed on the first dielectric layer pattern 222. Second conductive layer patterns 236 are formed on the second and third dielectric layer patterns 224 and 226. Processes of forming the above-mentioned elements are substantially similar to those that are previously illustrated with reference to FIGS. 3 to 10. Thus, further illustrations of the processes are omitted.

A third conductive layer 238a is formed on the first and second conductive layer patterns 234 and 236 to electrically connect the first conductive layer pattern 234 to the second conductive layer pattern 236.

As shown in FIG. 18, after the hard mask (not shown) is removed, upper portions of the third dielectric layer patterns 226 may be removed to insure electrical connection between the first and second conductive layer patterns 234 and 236.

After the third conductive layer 238a is formed, a non-volatile memory device (not shown) substantially similar to the non-volatile memory device 10 in FIG. 2 is completed by processes substantially similar to those that are previously illustrated with reference to FIGS. 12 to 14.

FIGS. 19 to 23 are cross-sectional views illustrating still another method of manufacturing the non-volatile memory device of FIG. 1.

Figure 19:
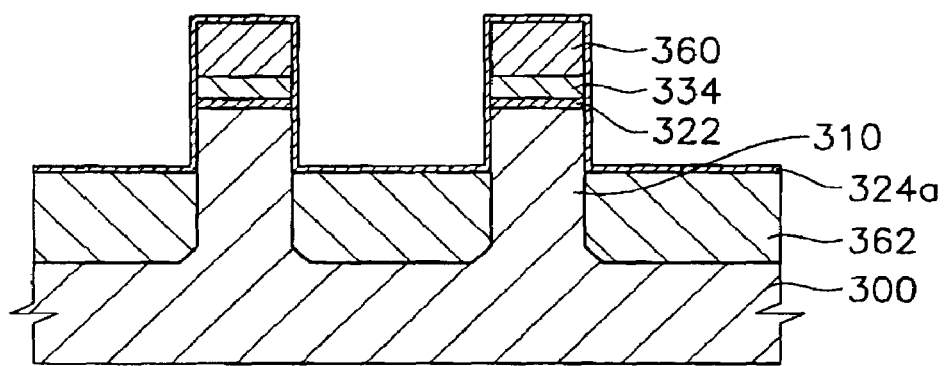
FIGS. 19 to 23 are cross-sectional views illustrating still another method of manufacturing the non-volatile memory device of FIG. 1.

Referring to FIG. 19, a fin body 310, a first dielectric layer pattern 322, a first conductive layer pattern 334, a hard mask 360 and an insulation layer pattern 362 are formed on a semiconductor substrate 300. Processes of forming the above-mentioned elements are substantially similar to those that are previously illustrated with reference to FIGS. 3 to 6. Thus, further illustrations of the processes are omitted.

A second dielectric layer 324a is formed on the insulation layer pattern 362, side surfaces of the fin body 310, side surfaces of the first dielectric layer pattern 322, side surfaces of the first conductive layer pattern 334 and the hard mask 360. Examples of the second dielectric layer 324a include a silicon oxide layer, a silicon oxide layer doped with fluorine, a silicon oxide layer doped with carbon, a layer including a low-k material, etc.

Figure 20:
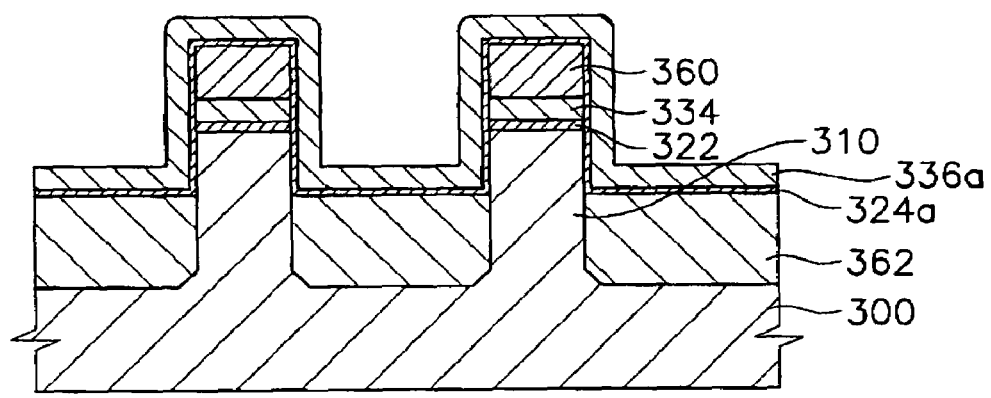

Referring to FIG. 20, a second conductive layer 336a including polysilicon doped with impurities is formed on the second dielectric layer 324a by an LPCVD process and an impurity-doping process.

Figure 21:
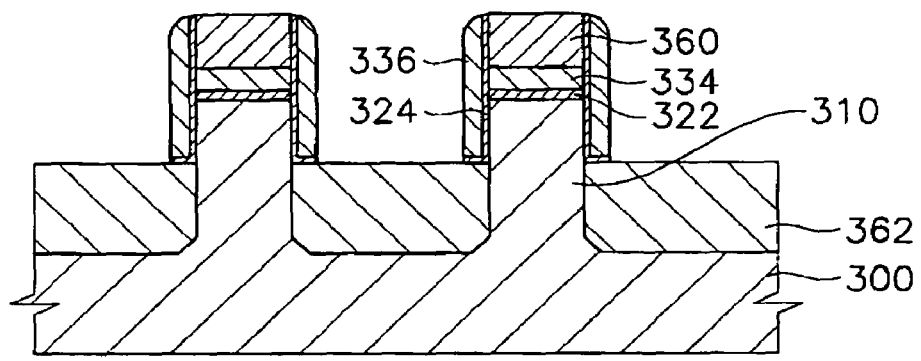

Referring to FIG. 21, the second conductive layer 336a and the second dielectric layer 324a are partially etched for exposing the hard mask 360 and the insulation layer pattern 362 to form a second insulation layer pattern 324 and a second conductive layer pattern 336.

Figure 22:
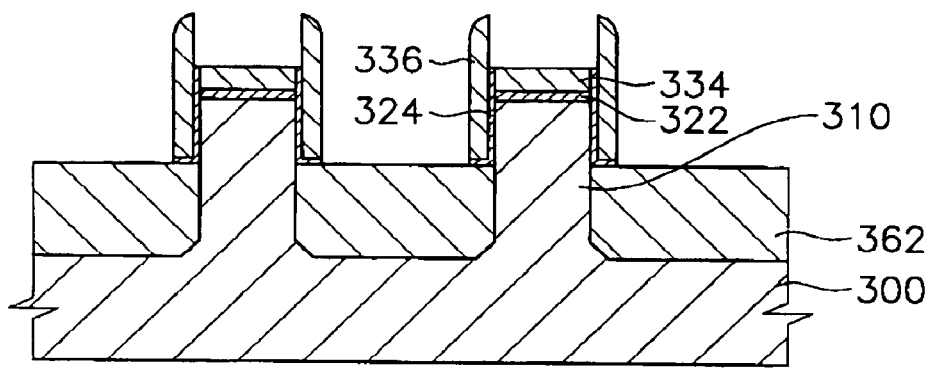

Referring to FIG. 22, after the hard mask 360 (see FIG. 21) is removed, upper portions of the second dielectric layer pattern 324, which are exposed by removing the hard mask 360, are removed by an isotropic etching process.

Figure 23:
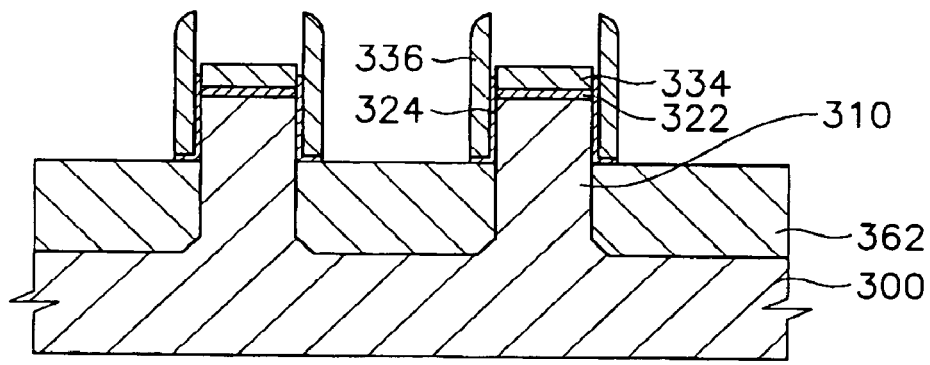

Referring to FIG. 23, to insure electrical connection between the first and second conductive layer patterns 334 and 336 in a successive process for forming a third conductive layer pattern (not shown), upper portions of the second dielectric layer patterns 324 may be removed. When the upper portions of the second dielectric layer patterns 324 are over etched, remaining upper surfaces of the second dielectric layer patterns 324 are lower than those of the first dielectric layer patterns 322.

After the second dielectric layer patterns 324 are over etched, a non-volatile memory device (not shown) substantially similar to the non-volatile memory device 10 in FIG. 1 is completed by processes substantially similar to those that are previously illustrated with reference to FIGS. 11 to 14.

According to the invention, the fin-type non-volatile memory device includes a floating gate electrode having an uneven upper surface. Thus, the second capacitance between the floating gate electrode and the control gate electrode in the non-volatile memory device of the invention is relatively increased compared to that in conventional non-volatile memory devices. On the contrary, the first capacitance between the fin body and the floating gate electrode in the non-volatile memory device of the invention is substantially identical to that in conventional non-volatile memory devices. Therefore, the coupling ratio of the non-volatile memory device may be increased without increasing an area of a cell. Also, the operation voltage of the non-volatile memory device may be decreased.

Further, the floating gate electrode may be self-aligned with the inner dielectric layer pattern by first, second and third conductive layer patterns. Accordingly, a photolithography process and an etching process for forming the floating gate electrode may be omitted, thereby improving productivity of the non-volatile memory device.

Having described exemplary embodiments of the invention, it is noted that modifications and variations can be made by persons skilled in the art in light of the above teachings. Therefore, it is to be understood that changes may be made to embodiments of the invention disclosed that are nevertheless still within the scope and the spirit of the invention as defined by the appended claims.

What is claimed is:

1. A semiconductor device comprising:
   a fin body protruded from a substrate, the fin body having a first side surface and a second side surface opposite to the first side surface, the fin body also having an upper surface;
   an inner dielectric layer pattern formed on the upper surface, the first side surface and the second side surface;
   a floating gate electrode formed on the inner dielectric layer pattern, the floating gate electrode having an uneven upper surface extending between the first and second side surfaces of the fin body;
   an outer dielectric layer formed on the floating gate electrode; and
   a control gate electrode formed on the outer dielectric layer, wherein a portion of the inner dielectric layer pattern on at least one of the first and second side surfaces is between the fin body and the floating gate electrode.

2. The semiconductor device of claim 1, wherein the fin body extends in a first direction, the first and second side surfaces of the fin body are disposed in a second direction substantially perpendicular to the first direction, and the control gate electrode extends in the second direction.

3. The semiconductor device of claim 2, wherein the floating gate electrode comprises a pair of protrusions opposite to each other in the second direction.

4. The semiconductor device of claim 3, wherein the inner dielectric layer pattern comprises:
   a first dielectric layer pattern formed on the upper surface of the fin body;
   second dielectric layer patterns formed on the first and second side surfaces of the fin body; and
   third dielectric layer patterns upwardly extending from the second dielectric layer patterns.

5. The semiconductor device of claim 4, wherein the second dielectric layer patterns are integrally formed with the third dielectric layer patterns.

6. The semiconductor device of claim 4, wherein the protrusions enclose the third dielectric layer patterns.

7. The semiconductor device of claim 4, wherein the floating gate electrode comprises:
   a first conductive layer pattern formed on the first dielectric layer pattern;
   second conductive layer patterns formed on the second and third dielectric layer patterns; and
   third conductive layer patterns electrically connected between the first and second conductive layer patterns.

8. The semiconductor device of claim 7, wherein the second conductive layer patterns have a height higher than that of the third dielectric layer patterns.

9. The semiconductor device of claim 7, wherein the third conductive layer patterns enclose the second conductive layer patterns and are electrically connected to the first conductive layer pattern.

10. The semiconductor device of claim 1, wherein the inner dielectric layer pattern is formed on a first portion of the fin body.

11. The semiconductor device of claim 10, wherein impurity regions are formed in second portions of the fin body, the second portions opposite to each other with respect to the first portion of the fin body.

12. The semiconductor device of claim 1, wherein the inner dielectric layer patterns comprises a silicon oxide layer, a silicon oxide layer doped with fluorine, a silicon oxide layer doped with carbon or a layer comprising a low-k material.

13. The semiconductor device of claim 1, wherein the outer dielectric layer comprises an oxide-nitride-oxide (ONO) layer or a layer comprising a high-k material.

14. A semiconductor device comprising:
a fin body protruded from a substrate, the fin body having a first side surface and a second side surface opposite to the first side surface;
an inner dielectric layer pattern including a first dielectric layer pattern formed on an upper surface of the fin body, second dielectric layer patterns formed on the first and second side surfaces of the fin body, and third dielectric layer patterns upwardly extending from the second dielectric layer patterns;
a floating gate electrode formed on the inner dielectric layer pattern, an upper surface of the floating gate electrode defining a recess comprising sidewall surfaces and a lower surface between the sidewall surfaces;
an outer dielectric layer formed on the floating gate electrode; and
a control gate electrode formed on the outer dielectric layer,
wherein the second dielectric layer patterns are between the fin body and the floating gate electrode.

15. The semiconductor device of claim 14, wherein the second dielectric layer patterns are integrally formed with the third dielectric layer patterns.

16. A semiconductor device comprising:
a fin body protruded from a substrate, the fin body having a first side surface and a second side surface opposite to the first side surface;
an inner dielectric layer pattern formed on an upper surface, the first side surface and the second side surface of the fin body and having an H-shaped cross section;
a floating gate electrode formed on the inner dielectric layer pattern, the floating gate electrode comprising a first portion and a second portion, wherein the first portion is located on the upper surface of the fin body, wherein an upper surface of the first portion is below an upper surface of the second portion;
an outer dielectric layer formed on the floating gate electrode; and
a control gate electrode formed on the outer dielectric layer,
wherein a portion of the inner dielectric layer pattern on at least one of the first and second side surfaces is between the fin body and the floating gate electrode.

17. The semiconductor device of claim 16, wherein the inner dielectric layer pattern comprises:
a first dielectric layer pattern formed on the upper surface of the fin body; and
second dielectric layer patterns formed on the first and second side surfaces of the fin body,
wherein the first dielectric layer pattern is positioned between central portions of the second dielectric layer patterns.

18. A semiconductor device comprising:
a fin body protruded from a substrate, the fin body having a first side surface and a second side surface opposite to the first side surface;
an inner dielectric layer pattern formed on an upper surface, the first side surface and the second side surface of the fin body;
a floating gate electrode including a first conductive layer pattern formed on an upper surface of the inner dielectric layer pattern, second conductive layer patterns formed on side surfaces of the inner dielectric layer patterns and having a height higher than that of the first conductive layer pattern, and third conductive layer pattern electrically connected between the first and second conductive layer patterns;
an outer dielectric layer formed on the floating gate electrode; and
a control gate electrode formed on the outer dielectric layer,
wherein a portion of the inner dielectric layer pattern on at least one of the first and second side surfaces is between the fin body and the floating gate electrode.

19. The semiconductor device of claim 18, wherein the inner dielectric layer pattern comprises:
a first dielectric layer pattern formed on the upper surface of the fin body;
second dielectric layer patterns formed on the first and second side surfaces of the fin body; and
third dielectric layer patterns formed on side surfaces of the first conductive layer pattern.

20. The semiconductor device of claim 19, wherein the third conductive layer patterns enclose the second conductive layer patterns and are electrically connected to the first conductive layer pattern.

21. The semiconductor device of claim 19, wherein the second dielectric layer patterns are integrally formed with the third dielectric layer patterns.

22. A method of manufacturing a semiconductor device comprising:
sequentially forming a first dielectric layer and a first conductive layer on a substrate;
etching the first conductive layer, the first dielectric layer and the substrate to form a fin body protruded from the substrate and having first and second side surfaces opposite to each other, a first dielectric layer pattern and a first conductive layer pattern;
forming second dielectric layer patterns on side surfaces of the fin body, the first dielectric layer pattern and the first conductive layer pattern;
forming a floating gate electrode having an uneven upper surface on the first and second dielectric layer patterns, wherein the second dielectric layer patterns are between the fin body and the floating gate electrode;
forming an outer dielectric layer on the floating gate electrode; and
forming a control gate electrode on the outer dielectric layer.

23. The method of claim 22, wherein the fin body extends in a first direction, the first and second side surfaces are disposed in a second direction substantially perpendicular to the first direction, and the control gate electrode extends in the second direction.

24. The method of claim 22, further comprising forming a hard mask on the first conductive layer, wherein the fin body, the first conductive layer pattern, the first dielectric layer pattern are formed by an anisotropic etching process using the hard mask as an etching mask.

25. The method of claim 24, wherein forming the floating gate electrode comprises:
    forming a second conductive layer on the hard mask and the second dielectric layer patterns;
    partially removing the second conductive layer for exposing the hard mask to form second conductive layer patterns on side surfaces of the hard mask and the second dielectric layer patterns;
    removing the hard mask; and
    forming a conductive layer pattern electrically connected between the first and second conductive layer patterns to form the floating gate electrode including the first, second and third conductive layer patterns.

26. The method of claim 25, wherein the third conductive layer pattern encloses the second conductive layer patterns and is electrically connected to the first conductive layer pattern.

27. The method of claim 25, after removing the hard mask, further comprising removing upper portions of the second dielectric layer patterns.

28. The method of claim 24, further comprising:
    filling recesses with an insulation layer, the recesses formed at a surface portion of the substrate by etching the substrate; and
    partially removing the insulation layer for exposing the side surfaces of the fin body to form insulation layer patterns on bottom faces of the recesses.

29. The method of claim 28, wherein forming the floating gate electrode comprises:
    forming a second conductive layer on the hard mask, the second dielectric layer patterns and the insulation layer patterns;
    partially removing the second conductive layer for exposing the hard mask and the insulation layer patterns to form second conductive layer patterns on side surfaces of the hard mask and the second dielectric layer patterns;
    removing the hard mask; and
    forming a conductive layer pattern electrically connected between the first and second conductive layer patterns to form the floating gate electrode including the first, second and third conductive layer patterns.

30. The method of claim 29, wherein forming the third conductive layer pattern comprises:
    forming a third conductive layer on the first conductive layer pattern, the second conductive layer pattern and the insulation layer patterns; and
    partially removing the third conductive layer for exposing the insulation layer patterns to form the third conductive layer pattern.

31. The method of claim 22, wherein the first dielectric layer comprises a silicon oxide layer, a silicon oxide layer doped with fluorine, a silicon oxide layer doped with carbon or a layer comprising a low-k material.

32. The method of claim 22, wherein the first conductive layer pattern comprises a polysilicon layer doped with impurities, and the second dielectric layer pattern is formed by an oxidation process.

33. The method of claim 22, wherein the outer dielectric layer comprises an oxide-nitride-oxide (ONO) layer or a layer comprising a high-k material.

34. The method of claim 22, wherein forming the control gate electrode comprises:
    forming a second conductive layer on the outer dielectric layer; and
    patterning the second conductive layer to form the control gate electrode,
    wherein the control gate electrode extends in a direction substantially perpendicular to a length direction of the fin body, and portions of the fin body opposite to each other with respect to the control gate electrode are exposed in forming the control gate electrode.

35. The method of claim 34, further comprising doping the exposed portions of the fin body with impurities.

36. A method of manufacturing a semiconductor device comprising:
    sequentially forming a first dielectric layer, a first conductive layer and a hard mask layer on a substrate;
    etching the hard mask layer, the first conductive layer, the first dielectric layer and the substrate to form a fin body protruded from the substrate, a first dielectric layer pattern, a first conductive layer pattern and a hard mask;
    forming second dielectric layer patterns on side surfaces of the fin body, the first dielectric layer pattern and the first conductive layer pattern;
    forming a second conductive layer on the hard mask and the second dielectric layer pattern;
    partially removing the second conductive layer for exposing an upper surface of the hard mask to form second conductive layer patterns on side surfaces of the hard mask and the second dielectric layer patterns;
    removing the hard mask to expose the first conductive layer pattern;
    forming a third conductive layer pattern electrically connected between the first and second conductive layer patterns to form a floating gate electrode including the first, second and third conductive layer patterns;
    forming an outer dielectric layer on the floating gate electrode; and
    forming a control gate electrode on the outer dielectric layer.

37. A method of manufacturing a semiconductor device comprising:
    sequentially forming a first dielectric layer, a first conductive layer and a hard mask layer on a substrate;
    etching the hard mask layer, the first conductive layer, the first dielectric layer and the substrate to form a fin body protruded from the substrate, a first dielectric layer pattern, a first conductive layer pattern and a hard mask;
    forming a second dielectric layer on the fin body, the first dielectric layer pattern, the first conductive layer pattern and the hard mask;
    forming a second conductive layer on the second dielectric layer;
    partially removing the second conductive layer and the second dielectric layer for exposing an upper surface of the hard mask to form a second conductive layer pattern on side surfaces of the second dielectric layer;
    removing the hard mask to expose the first conductive layer pattern;
    removing portions of the second dielectric layer, the portions of the second dielectric layer being exposed by removing the hard mask;
    forming a third conductive layer pattern electrically connected between the first and second conductive layer patterns to form a floating gate electrode including the first, second and third conductive layer patterns;

forming an outer dielectric layer on the floating gate electrode; and forming a control gate electrode on the outer dielectric layer.

38. The method of claim 37, wherein the second dielectric layer comprises a silicon oxide layer, a silicon oxide layer doped with fluorine, a silicon oxide layer doped with carbon, and a layer comprising a low-k material.

* * * * *